United States Patent
Fujii

(10) Patent No.: US 8,227,862 B2
(45) Date of Patent: Jul. 24, 2012

(54) SEMICONDUCTOR DEVICE

(75) Inventor: Hiroki Fujii, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/347,180

(22) Filed: Jan. 10, 2012

(65) Prior Publication Data
US 2012/0104494 A1   May 3, 2012

Related U.S. Application Data

(62) Division of application No. 12/568,906, filed on Sep. 29, 2009, now Pat. No. 8,129,799.

(30) Foreign Application Priority Data

Sep. 30, 2008  (JP) ................. 2008-253366

(51) Int. Cl.
*H01L 29/76* (2006.01)
*H01L 31/062* (2012.01)
(52) U.S. Cl. ......... 257/341; 257/342; 257/343; 438/270
(58) Field of Classification Search ......... 257/341–343, 257/E29.256; 438/270
See application file for complete search history.

(56) References Cited

U.S. PATENT DOCUMENTS

| | | | |
|---|---|---|---|
| 5,262,345 A * | 11/1993 | Nasser et al. | 438/203 |
| 5,382,535 A | 1/1995 | Malhi et al. | |
| 5,407,844 A | 4/1995 | Smayling et al. | |
| 5,510,643 A | 4/1996 | Kariyama | |
| 6,027,963 A | 2/2000 | Peidous | |
| 6,306,700 B1 | 10/2001 | Yang | |
| 6,784,490 B1 | 8/2004 | Inoue et al. | |
| 7,312,481 B2 | 12/2007 | Chen et al. | |
| 7,915,131 B2 * | 3/2011 | Nakagawa et al. | 438/300 |
| 2003/0218232 A1 | 11/2003 | Mathews et al. | |
| 2004/0012068 A1 | 1/2004 | Iwata et al. | |
| 2004/0171202 A1 | 9/2004 | Kim | |
| 2008/0135985 A1 | 6/2008 | Lerner et al. | |
| 2009/0032870 A1 | 2/2009 | Lida | |

FOREIGN PATENT DOCUMENTS

JP  2001-94103  4/2001

* cited by examiner

*Primary Examiner* — Theresa T Doan
(74) *Attorney, Agent, or Firm* — Young & Thompson

(57) ABSTRACT

A field-effect transistor (142) includes a lowly p-doped region 110 formed on a surface of a substrate (102), an n-doped drain region 112 and n-doped source region 114 arranged on a surface of the lowly p-doped region 110, and a device isolation insulating film 132 and device isolation insulating film 134. Here, the device isolation insulating film 132 is formed greater in film thickness than the device isolation insulating film 134; and in the n-doped source region 114, the peak concentration section having a highest dopant concentration is formed in a deeper position than in the n-doped drain region 112.

8 Claims, 12 Drawing Sheets

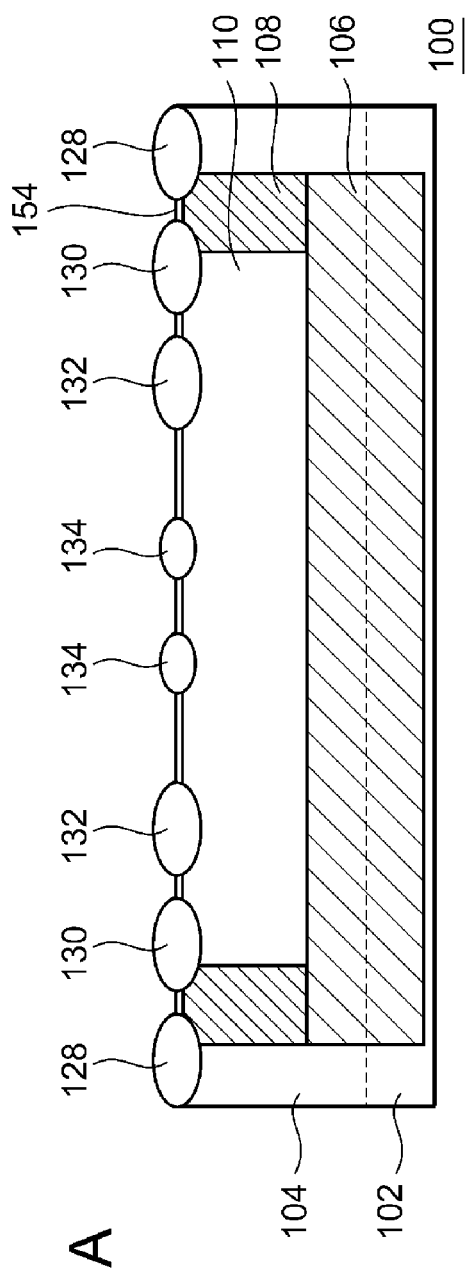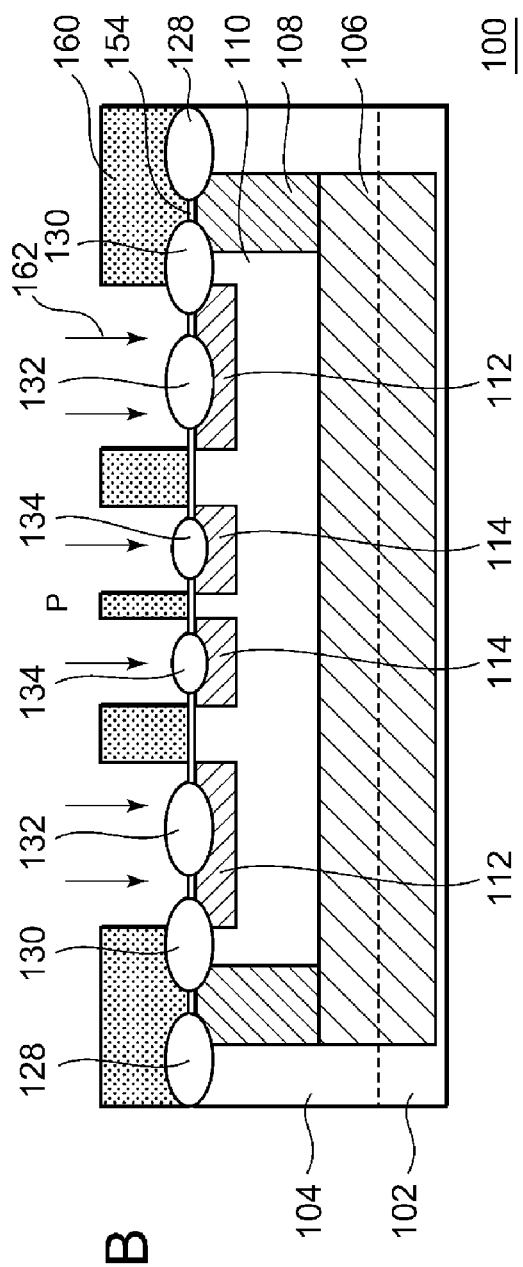

US 8,227,862 B2

SEMICONDUCTOR DEVICE

CROSS REFERENCE TO RELATED APPLICATIONS

This application is a division of co-pending application Ser. No. 12/568,906 filed on Sep. 29, 2009, which claims foreign priority to Japanese patent application No. 2008-253366 filed on Sep. 30, 2008. The entire content of each of these applications is hereby expressly incorporated by reference.

BACKGROUND OF THE INVENTION

The present invention relates to a semiconductor device and a method of fabricating the device, and more particularly to a semiconductor device including a field-effect transistor and a method of fabricating the device.

Among high voltage transistors, a structure called a LOCOS offset type is known which includes a thick field oxide film (thereinafter referred to as LOCOS) at an end of a gate electrode or between the gate electrode and a drain diffusion layer and between the gate electrode and a source diffusion layer.

Japanese Patent Laid-Open No. 2001-94103 discloses a high voltage transistor structure. In this structure, an offset diffusion layer in the source side has the same concentration and depth as an offset diffusion layer in the drain side, but the size of the offset diffusion layer is set greater in the source side than in the drain side. More specifically, when the size of the offset diffusion layer in the drain side is Ld and the size of the offset diffusion layer in the source side is Ls, Ld is set smaller than Ls. Accordingly, the resistance of the offset diffusion layer in the source side becomes greater and thus the source voltage VS becomes higher. Consequently, when the substrate voltage is VW, VW minus the forward junction breakdown voltage of silicon can be readily kept equal or smaller than VS and the sustaining breakdown voltage becomes higher.

However, the present inventor has noticed that, since the size Ld of the offset diffusion layer in the drain side is smaller than the size Ls of the offset diffusion layer in the source side according to the technique described in Japanese Patent Laid-Open No. 2001-94103, the gate-source distance becomes longer and thus the On-resistance becomes higher. Further, since the size of the offset diffusion layer in the drain side is small, the Off-breakdown voltage becomes lower.

SUMMARY

According to the present invention, there is provided a semiconductor device including:

a lowly doped region of a first conduction type formed in a substrate;

a channel region arranged in the lowly doped region of the first conduction type;

a gate electrode formed over the channel region;

a drain region of a second conduction type formed in a part of the surface of the lowly doped region of the first conduction type;

a drain electrode formed within the drain region of the second conduction type;

a source region of the second conduction type formed in a part of the surface of the lowly doped region of the first conduction type and formed in a region facing the drain region of the second conduction type so that the channel region lies between the source region and the drain region;

a source electrode formed within the source region of the second conduction type;

a first device isolation insulating film lying between the channel region and the drain electrode and formed over the drain region of the second conduction type; and a second device isolation insulating film lying between the channel region and the source electrode and formed over the source region of the second conduction type, wherein the first device isolation insulating film is greater in film thickness than the second device isolation insulating film.

According to the present invention, there is provided a semiconductor device fabricating method including:

forming a lowly doped region of a first conduction type in a substrate;

forming over the substrate, a first device isolation film and a second device isolation film smaller in film thickness than the first device isolation film;

forming on a surface of the lowly doped region of the first conduction type, a drain region of a second conduction type isolated by the first device isolation film and a source region of the second conduction type isolated by the second device isolation film and arranged so that a channel region lies between the drain region and the source region;

forming a gate electrode over the channel region;

forming the drain electrode on a side of a surface of the drain region which is isolated from the channel region by the first device isolation film; and forming the source electrode on a side of a surface of the source region which is isolated from the channel region by the second device isolation film.

With this structure, the gate-source resistance can be lowered so that the On-resistance can be reduced and the Off-breakdown voltage can be kept higher. Here, the substrate may be a semiconductor wafer or may be composed of a semiconductor layer such as an epitaxial layer formed on a semiconductor wafer.

Any combination of the above constituent elements, and modifications to the description of the invention interconverted between a method, apparatus and the like are also effective as aspects of the invention.

BRIEF DESCRIPTION OF THE DRAWINGS

The above and other objects, advantages and features of the present invention will be more apparent from the following description taken in conjunction with the accompanying drawings, in which:

FIGS. 8A and 8B are process sectional views showing the procedure of fabricating the semiconductor device according to the embodiment of the present invention;

DETAILED DESCRIPTION OF PREFERRED EMBODIMENTS

Figure 1:
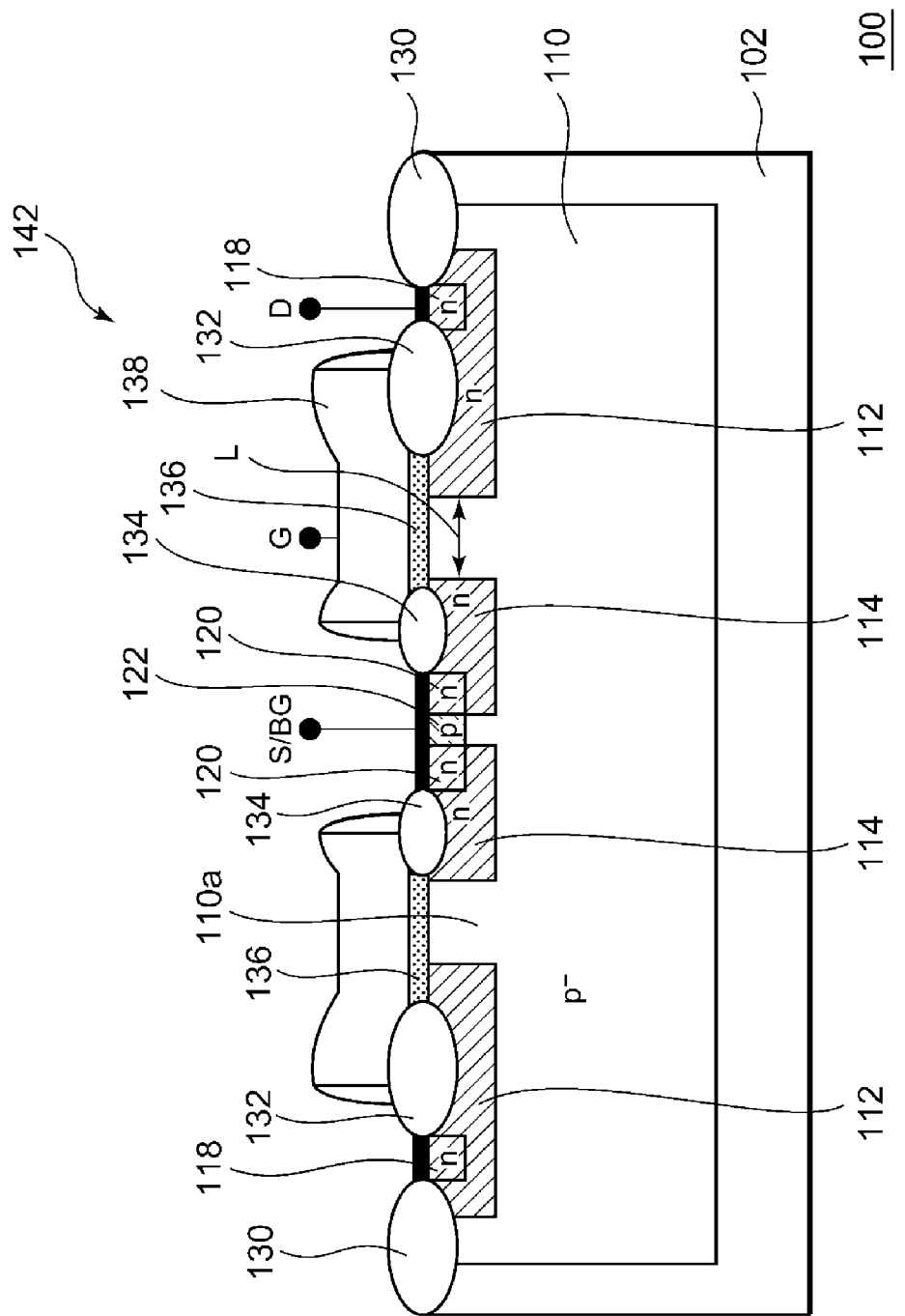
FIG. 1 is a sectional view illustrating a structure of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The present invention will be described below with reference to the drawings showing embodiments thereof. Here, the same reference numerals are applied to corresponding parts in all the figures, and an explanation thereof is omitted.

First Embodiment

Figure 2:
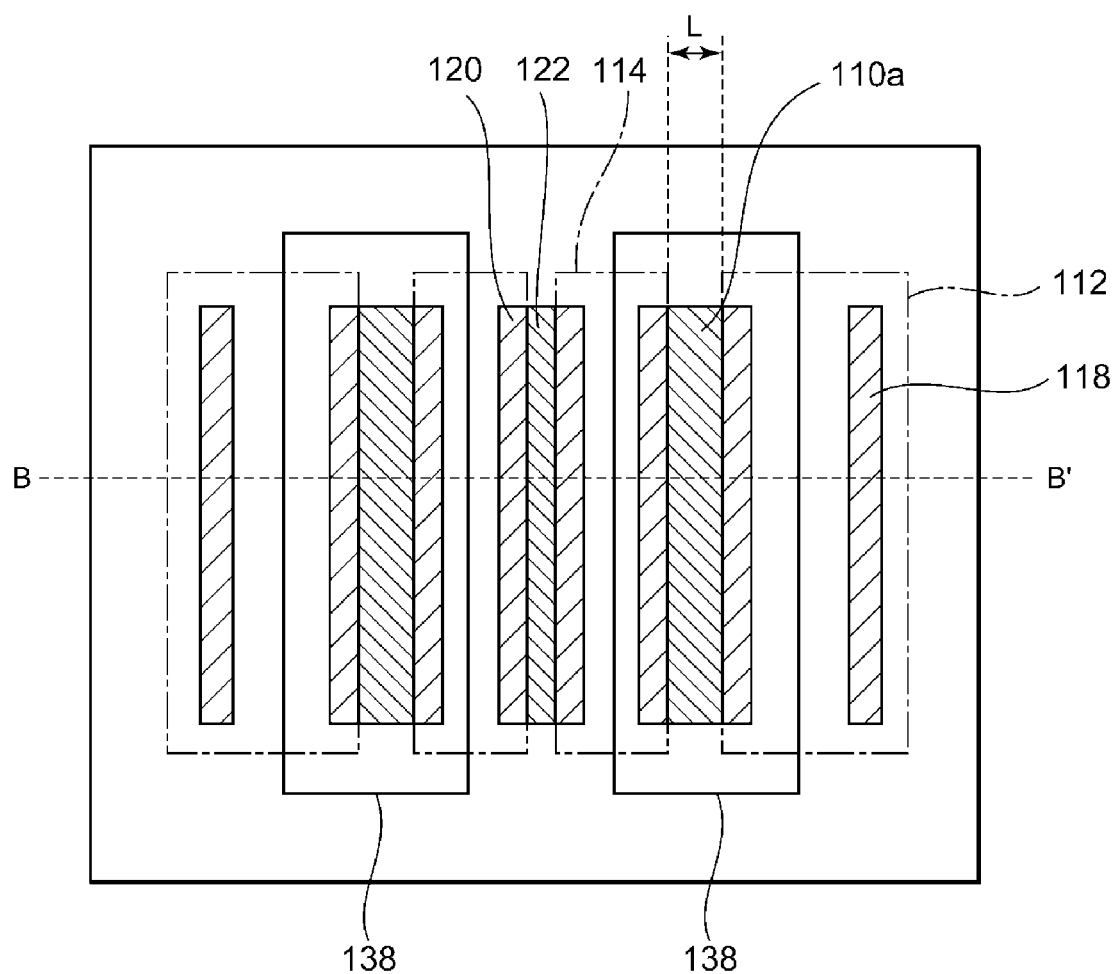
FIG. 2 is a plan view illustrating the structure of the semiconductor device according to the embodiment of the present invention.

FIG. 1 is a sectional view illustrating a structure of a semiconductor device according to the present embodiment. FIG. 2 is a plan view illustrating the structure of the semiconductor device of FIG. 1. FIG. 1 corresponds to a sectional view taken along the line B-B' of FIG. 2.

According to the present embodiment, a semiconductor device 100 includes a semiconductor substrate 102 ("substrate" for short) and a high voltage transistor 142 (field effect transistor) formed on the semiconductor substrate 102.

According to the present embodiment, the high voltage transistor 142 includes a channel region 110a of a gate length of L formed on a surface of the semiconductor substrate 102, a gate insulating film 136 and a gate electrode 138 formed over the channel region 110a, and a source electrode 120 and a drain electrode 118 formed in two sides of the gate electrode 138.

The high voltage transistor 142 includes a lowly p-doped region 110 (first conduction type) formed on a surface of the semiconductor substrate 102, a n-doped drain region 112 (second conduction type) arranged on a surface of the lowly p-doped region 110 and having a drain electrode 118 formed on a part of the surface thereof, and an n-doped source region 114, arranged on a surface of the lowly p-doped region 110 so that the channel region 110a lies between the n-doped drain region 112 and the n-doped source region 114, and having the source electrode 120 formed on a part of the surface thereof. That is, according to the present embodiment, the channel region 110a is composed of the lowly p-doped region 110.

The high voltage transistor 142 further includes a device isolation insulating film 132 (first device isolation film), a device isolation insulating film 134 (second device isolation film) and a device isolation insulating film 130 formed over the n-doped drain region 112. The device isolation insulating film 132 is formed over the n-doped drain region 112 and separates the n-doped drain region 112 on a surface of the semiconductor substrate 102 and also isolates the channel region 110a from the drain electrode 118. The device isolation insulating film 134 is formed over the n-doped source region 114 and separates the n-doped source region 114 on a surface of the semiconductor substrate 102 and also isolates the channel region 110a from the source electrode 120. These device isolation insulating films can be formed by LOCOS (local oxidation of silicon).

The device isolation insulating film 134 may be formed smaller in film thickness than the device isolation insulating film 132 and the device isolation insulating film 130. Accordingly, when ion is subsequently implanted to form the n-doped drain region 112 and the n-doped source region 114, the dopant ion can be implanted deeper through the device isolation insulating film 134. As a result, in the n-doped source region 114, the peak concentration section having a highest dopant concentration can be formed in a deeper position than in the n-doped drain region 112. Consequently, the gate-source resistance can be reduced and thus the On-resistance can be reduced. Further, the device isolation insulating film 134 can be formed smaller in width than the device isolation insulating film 132 and the device isolation insulating film 130, so the distance between the channel region 110a and the source electrode 120 can be shortened and thus the On-resistance can be reduced and also the device area can be reduced. Further, since the drain-gate distance can be kept longer, the Off-breakdown voltage of the high voltage transistor 142 can be kept higher. Also, when the distance between the channel region 110a and the source electrode 120 is shortened, the base resistance of a parasitic bipolar transistor can also be reduced, so the On-breakdown voltage can be improved.

According to the present embodiment, the high voltage transistor 142 further includes a back gate electrode 122 arranged adjacent to the source electrode 120. According to the present embodiment, the source electrode 120 and the back gate electrode 122 may be short-circuited on the diffusion layer. Accordingly, the base resistance of the parasitic bipolar transistor is reduced, so the On-breakdown voltage can be improved. Also, according to the present embodiment, the semiconductor device 100 is formed symmetrical around the back gate electrode 122. Further, formed in an outer side of the drain electrode 118 is the device isolation insulating film 130.

Referring to FIG. 2, the white-colored portions indicate the device isolation insulating films (the device isolation insulating film 130, device isolation insulating film 132 and device isolation insulating film 134); and for the convenience of explanation, the gate electrode 138 is indicated only by the line.

Figure 3A:
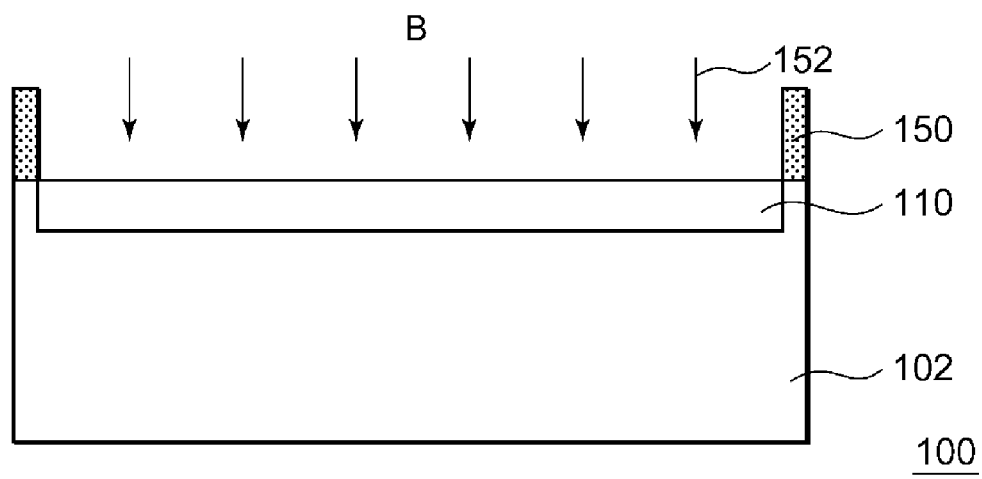
FIGS. 3A and 3B are process sectional views showing a procedure of fabricating the semiconductor device according to the embodiment of the present invention.

A procedure of fabricating the semiconductor device 100 according to the present embodiment will be described. FIGS. 3 and 4 are process sectional views showing a procedure of fabricating the semiconductor device 100 according to the present embodiment.

First, a photoresist 150 of a predetermined opening pattern is formed on the semiconductor substrate 102, and p-type ion 152 is implanted using the photoresist 150 as a mask. Here, boron (B) may be used as the p-type ion 152. As a result, the lowly p-doped region 110 is formed on a surface of the semiconductor substrate 102 (FIG. 3A).

Subsequently, the device isolation insulating film 130, the device isolation insulating film 132, the device isolation insulating film 134 and an oxide film 154 are formed on a surface of the semiconductor substrate 102. These device isolation insulating films can be formed by LOCOS (local oxidation of silicon). The device isolation insulating film can be formed by the following procedure. First, the oxide film 154 is formed wholly on the surface of the semiconductor substrate 102, and thereafter a mask film such as a silicon nitride film is formed on the oxide film 154. The mask film is a portion where the device isolation insulating film 130, the device isolation insulating film 132, the device isolation insulating film 134 are to be formed, and is patterned into an opening. Here, the opening where the device isolation insulating film 134 is to be formed smaller in width than those openings where the device isolation insulating film 130 and the device isolation insulating film 132 are to be formed. Thereafter, the surface of the semiconductor substrate 102 which is not covered with the mask film is locally oxidized, whereby the device isolation insulating film 130, the device isolation insulating film 132, and the device isolation insulating film 134 are formed. Here, since the opening where the device isolation insulating film 134 is to be formed is formed smaller in width, the device isolation insulating film 134 can be formed smaller in film thickness and smaller in width than the device isolation insulating film 130 and the device isolation insulating film 132.

Figure 3B:
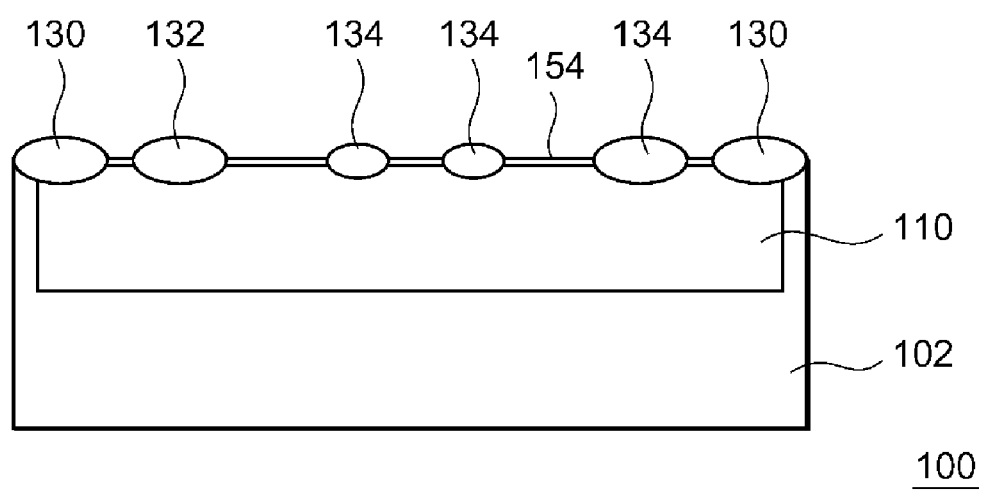
Figure 4:
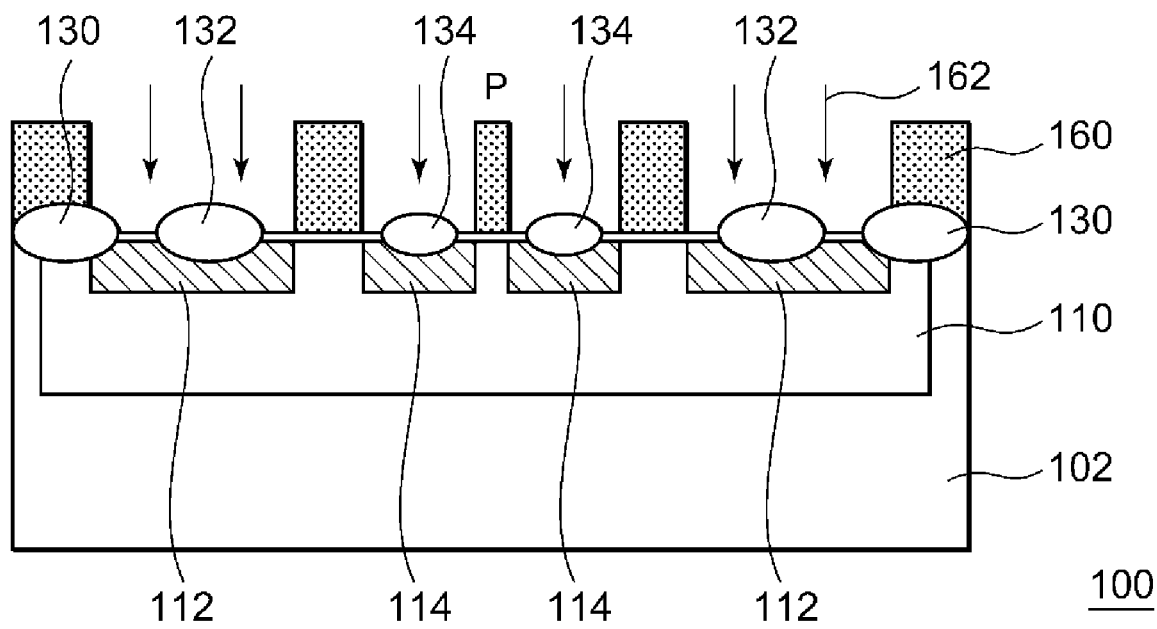
FIG. 4 is a process sectional view showing the procedure of fabricating the semiconductor device according to the embodiment of the present invention.

Subsequently, a high-temperature burying treatment (for example, for several hours at about 1200° C.) is applied to diffuse the lowly p-doped region 110 (FIG. 3B).

Subsequently, a photoresist 160 of a predetermined opening pattern is formed on the semiconductor substrate 102, and n-type ion 162 is implanted using the photoresist 160 as a mask. Here, phosphorus (P) may be used as the n-type ion 162. As a result, in the lowly p-doped region 110, the n-doped drain regions 112 are formed under the device isolation insulating film 132 and below an end of the device isolation insulating film 130 in the device isolation insulating film 132 side. Also, in the lowly p-doped region 110, the n-doped source region 114 is formed in parallel under the device isolation insulating film 134 (FIG. 4). Here, since the device isolation insulating film 134 is smaller in film thickness than the device isolation insulating film 132, the dopant ion is implanted deeper through the device isolation insulating film 134. As a result, in the n-doped source region 114, the peak concentration section having a highest dopant concentration can be formed in a deeper position than in the n-doped drain region 112.

According to the present embodiment, the n-doped source region 114 and the n-doped drain region 112 can be formed by the same ion implantation process using the same photoresist 160. Accordingly, the number of resists can be reduced to simplify the process.

Subsequently, the gate insulating film 136 is formed on the semiconductor substrate 102. Here, the gate insulating film 136 may have a great film thickness of 50 nm to 200 nm, for example. Subsequently, a conductive layer constituting the gate electrode 138 is formed on the gate insulating film 136, and the gate electrode 138 and the conductive layer are patterned into a gate shape. Thereafter, a side wall is formed on a side wall of the gate electrode 138.

Thereafter, n-type ion is implanted in a region corresponding to the drain electrode 118 and the source electrode 120 and in addition, p-type ion is implanted in a region corresponding to the back gate electrode 122. Further, the surfaces of these regions are changed to silicide to form the drain electrode 118, source electrode 120 and back gate electrode 122. According to the present embodiment, the source electrode 120 and the back gate electrode 122 may be short-circuited on a diffusion layer.

In the semiconductor device 100 according to the present embodiment, the gate-source resistance can be reduced and thus the On-resistance can be reduced. In addition, the distance between the channel region 110a and the source electrode 120 can be shortened, so the On-resistance can be reduced and the device area can be reduced. Further, the drain-gate distance can be kept longer, so the Off-breakdown voltage of the high voltage transistor 142 can be kept higher.

In the semiconductor device 100, the n-doped drain region 112, lowly p-doped region 110 and n-doped source region 114 correspond to the emitter, base and collector regions of a parasitic bipolar transistor; and when a high voltage is applied, the parasitic bipolar transistor may be turned on by holes produced by impact ionization in the n-doped drain region 112. In the semiconductor device 100 according to the present embodiment, however, the base resistance of the parasitic bipolar transistor can be reduced, so the On-breakdown voltage can be improved.

Second Embodiment

Figure 5:
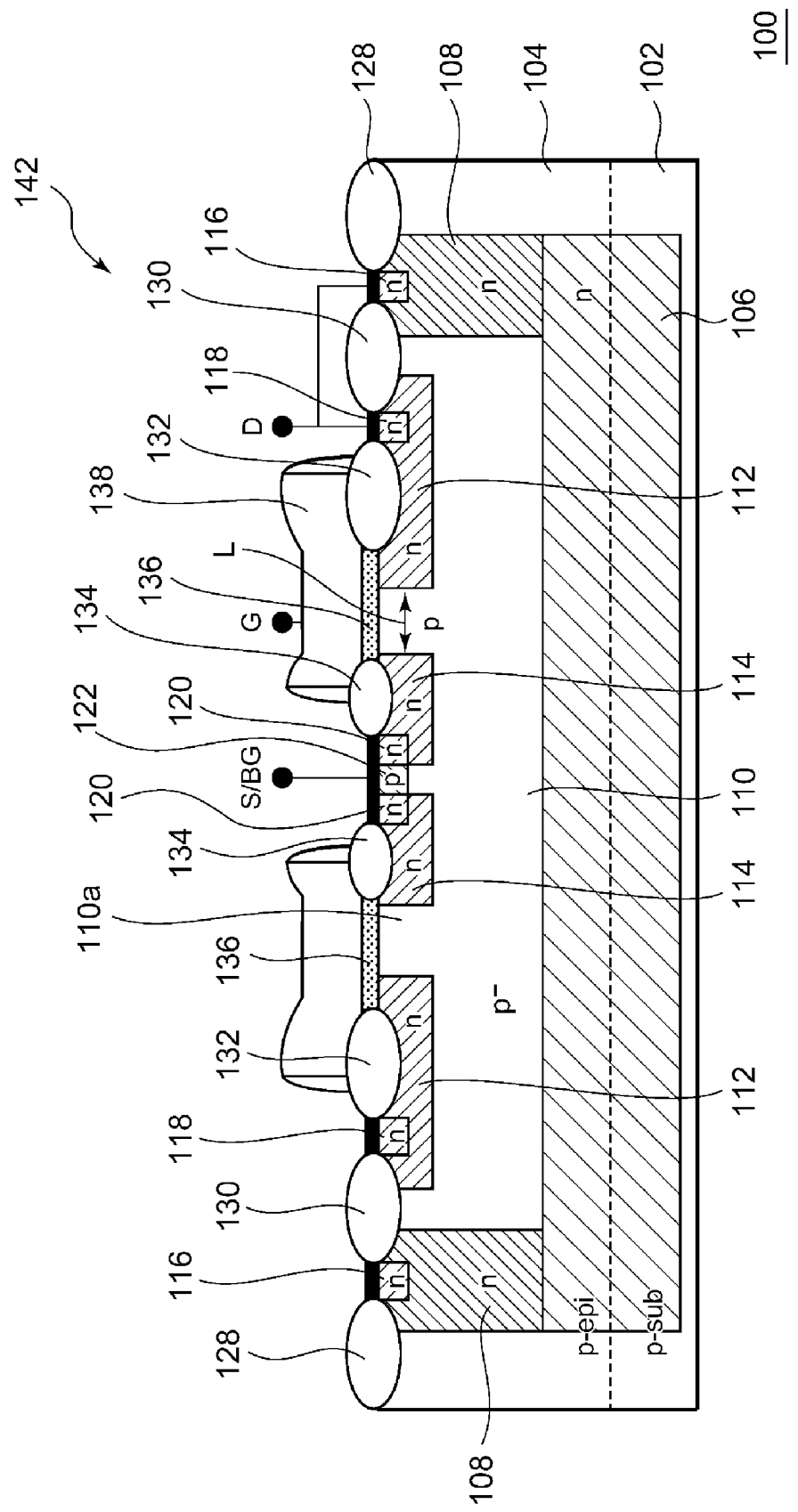
FIG. 5 is a sectional view illustrating a structure of a semiconductor device according to an embodiment of the present invention.
Figure 6:
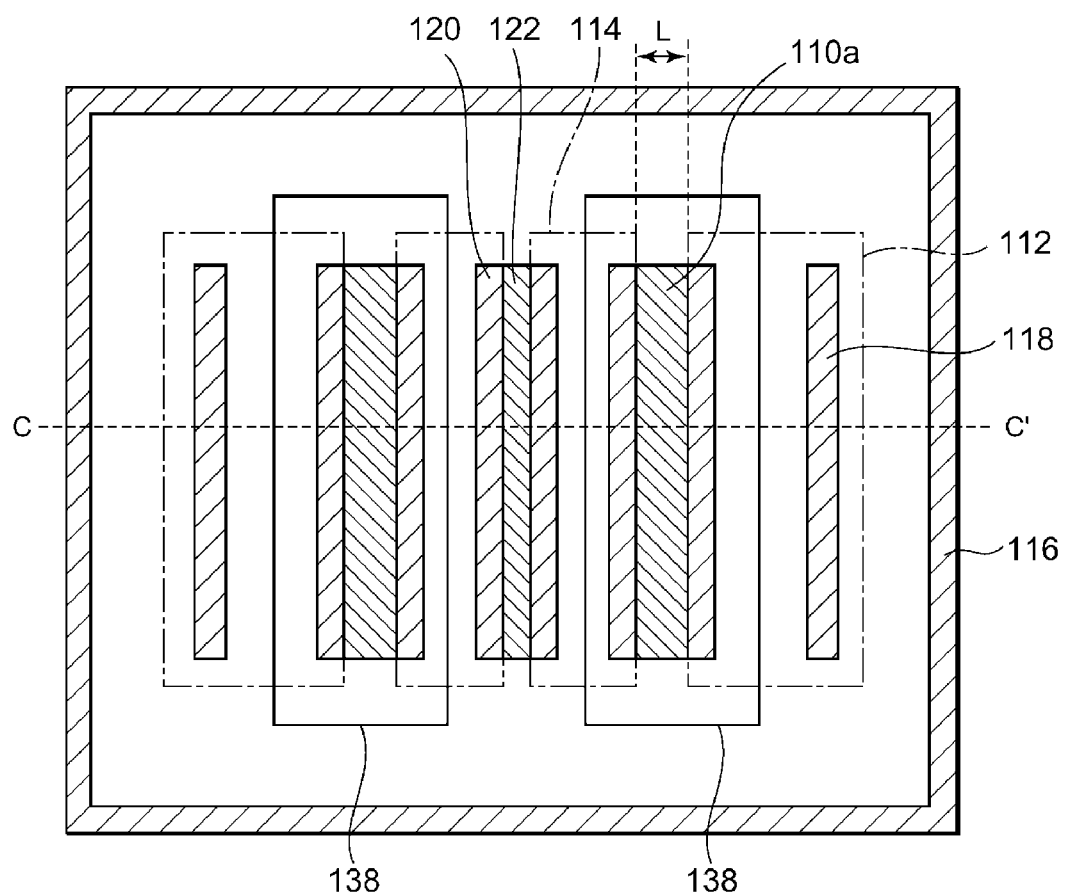
FIG. 6 is a plan view illustrating the structure of the semiconductor device according to the embodiment of the present invention.

FIG. 5 is a sectional view illustrating a structure of a semiconductor device according to the present embodiment. FIG. 6 is a plan view illustrating the structure of the semiconductor device of FIG. 5. FIG. 5 corresponds to a sectional view taken along the line C-C' of FIG. 6.

According to the present embodiment, a substrate of the semiconductor device 100 may be composed of a semiconductor layer 104 formed on a semiconductor substrate 102 being a semiconductor wafer. The semiconductor substrate 102 may be a p-doped silicon substrate (silicon wafer), for example. The semiconductor layer 104 may be a p-doped silicon epitaxial layer, for example. Formed within the semiconductor substrate 102 and semiconductor layer 104 of the semiconductor device 100 are a buried n-doped region 106 and an n-doped sinker region 108 formed on the buried n-doped region 106 and formed continuously from the buried n-doped region 106 to a surface of the semiconductor layer 104. According to the embodiment of the present invention, the lowly p-doped region 110 is formed in a region surrounded by the buried n-doped region 106 and n-doped sinker region 108 within the semiconductor layer 104. The concentration of the buried n-doped region 106 and n-doped sinker region 108 may be set to 1e19 to 1e20 cm-3. Since the buried n-doped region 106 and the n-doped sinker region 108 are provided, a predetermined potential can be set at the back gate electrode 122. Thus, when this structure is used, NMOS such as the semiconductor device 100 according to the present embodiment can be used in a power source side (high side) of a circuit, instead of PMOS having a relatively lower current capacity.

An n-doped drain region 112 and n-doped sinker region 108 are isolated by a device isolation insulating film 130. Formed on a surface of the n-doped sinker region 108 is a drain electrode 116. The drain electrode 116 is electrically connected to the drain electrode 118. Further, formed in an outer side of the drain electrode 116 is a device isolation insulating film 128.

A procedure of fabricating the semiconductor device 100 according to the present embodiment will be described. FIGS. 7 and 8 are process sectional views showing the procedure of fabricating the semiconductor device 100 according to the present embodiment.

Figure 7A:
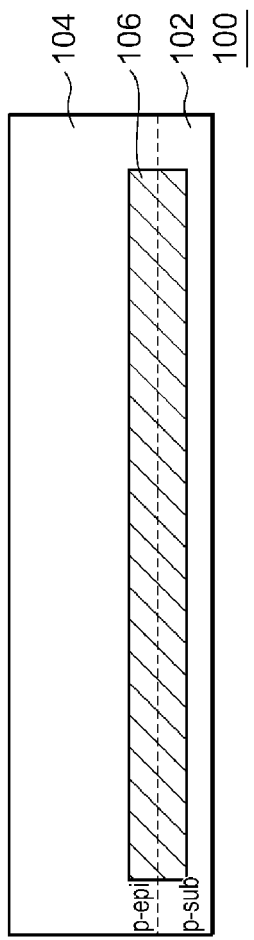
FIGS. 7A to 7C are process sectional views showing a procedure of fabricating the semiconductor device according to the embodiment of the present invention.
Figure 7B:
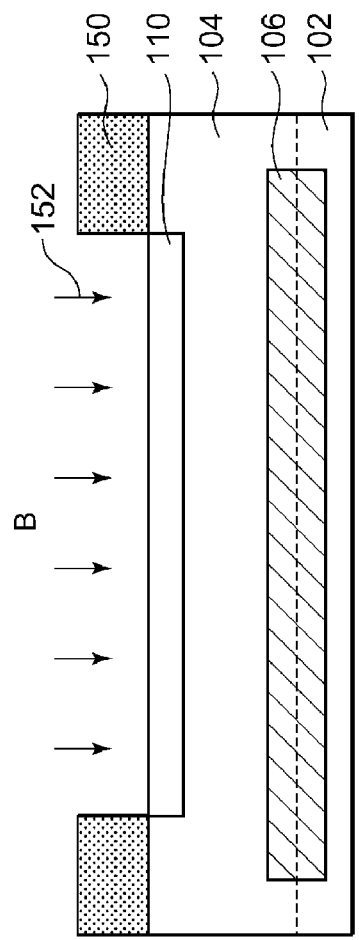

First, the buried n-doped region 106 is formed on a surface of the semiconductor substrate 102 and thereafter the semiconductor layer 104 is formed on the semiconductor substrate 102 by epitaxial growth. As a result, the buried n-doped region 106 is also arranged within the semiconductor layer 104 (FIG. 7A). Subsequently, a photoresist 150 having a predetermined opening pattern is formed on the semiconductor layer 104, and p-type ion 152 is implanted using the photoresist 150 as a mask. Here, the p-type ion 152 may be boron (B). As a result, the lowly p-doped region 110 is formed on a surface of the semiconductor layer 104 (FIG. 7B).

Subsequently, a device isolation insulating film 128, device isolation insulating film 130, device isolation insulating film 134 and oxide film 154 are formed on a surface of the semiconductor layer 104. These device isolation insulating films can be formed by LOCOS (local oxidation of silicon). According to the embodiment of the present invention, also, the device isolation insulating film 134 may be formed smaller in film thickness and smaller in width than the device isolation insulating film 132 and the device isolation insulating film 130.

Figure 7C:
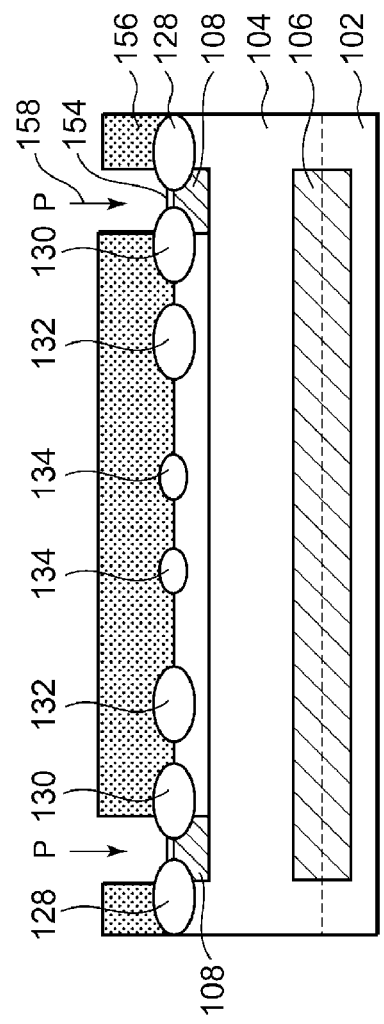

Thereafter, a photoresist 156 having a predetermined opening pattern is formed on the semiconductor layer 104, and n-type ion 158 is implanted using the photoresist 156 as a mask. Here, the n-type ion 158 may be phosphorus (P). As a result, the n-doped sinker region 108 is formed (FIG. 7C).

Subsequently, a high-temperature burying treatment (for example, for several hours at about 1200° C.) is applied to diffuse the buried n-doped region 106, n-doped sinker region 108 and lowly p-doped region 110. As a result, the buried n-doped region 106 and n-doped sinker region 108 are formed continuously around the lowly p-doped region 110 (FIG. 8A).

Subsequently, a photoresist 160 having a predetermined opening pattern is formed on the semiconductor layer 104, and n-type ion 162 is implanted using the photoresist 160 as a mask. Here, the n-type ion 162 may be phosphorus (P). As a result, in the lowly p-doped region 110, the n-doped drain regions 112 are formed under the device isolation insulating film 132 and below an end of the device isolation insulating film 130 in the device isolation insulating film 132 side. Also, in the lowly p-doped region 110, an n-doped source region 114 is formed under the device isolation insulating film 134 (FIG. 8A).

Subsequently, a gate insulating film 136 is formed on the semiconductor layer 104. Here, the gate insulating film 136 may be 50 nm to 200 nm in film thickness, for example. Subsequently, a conductive layer constituting a gate electrode 138 is formed on the gate insulating film 136, and the gate electrode 138 and the conductive layer are patterned into a gate shape. Thereafter, a side wall is formed on a side wall of the gate electrode 138.

Thereafter, a drain electrode 118, source electrode 120 and back gate electrode 122 are formed, whereby the semiconductor device 100 having a structure similar to that illustrated in FIG. 5 is provided.

The present embodiment has an advantageous effect similar to that of the first embodiment.

(Simulation Result)

Figure 9:
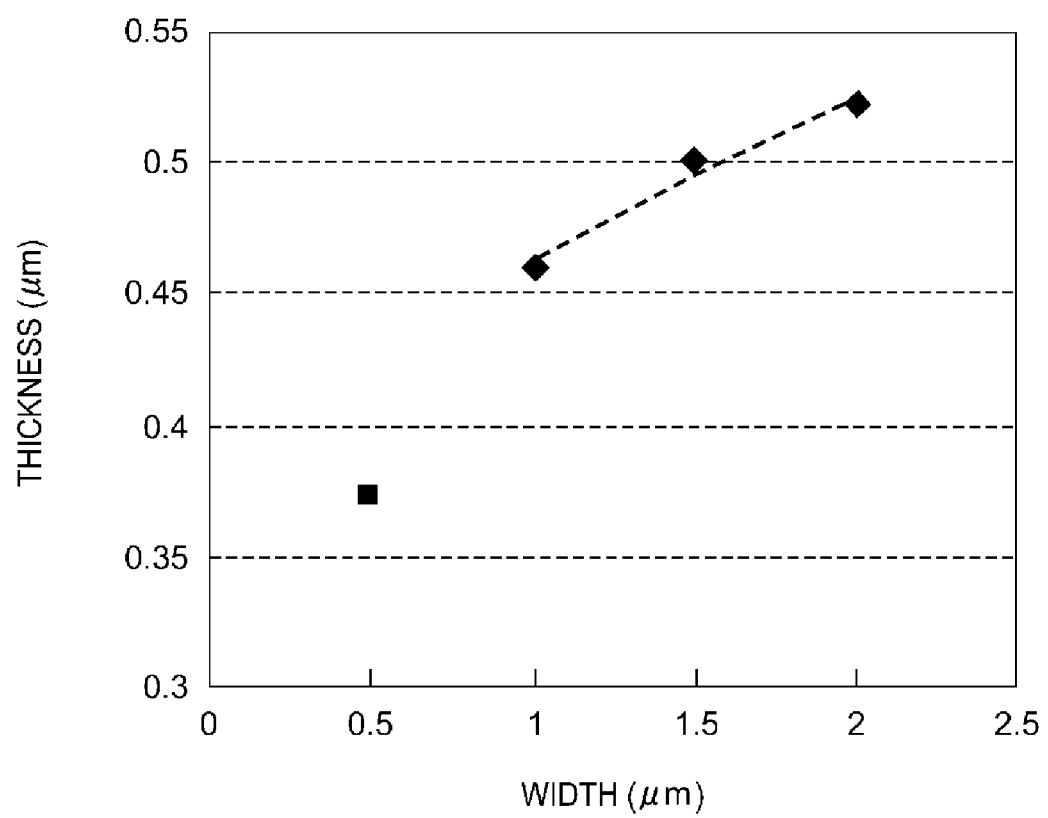
FIG. 9 is a view illustrating a simulation result when it is assumed that a semiconductor device is used which has a structure similar to that described with reference to the embodiment of the present invention.

FIG. 9 is a view illustrating a result of simulating the relationship between the width and film thickness of the device isolation insulating film 134 when it is assumed that the semiconductor device 100 is used which has a structure similar to that described with reference to the first embodiment and when the device isolation insulating film 134 is formed by LOCOS.

Figure 10:
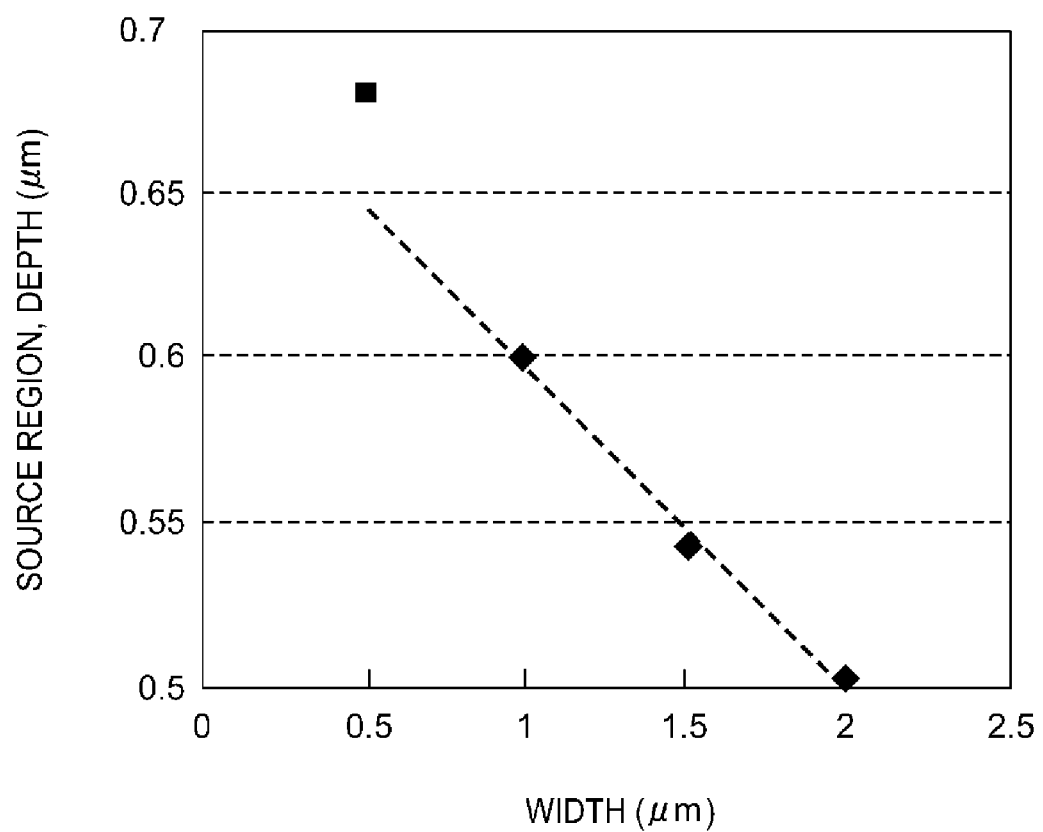
FIG. 10 is a view illustrating a simulation result when it is assumed that a semiconductor device is used which has a structure similar to that described with reference to the embodiment of the present invention.

FIG. 10 is a view illustrating a result of simulating the relationship between the width of the device isolation insulating film 134 and the depth of a peak concentration section in an n-doped source region 114 formed under the device isolation insulating film 134 when it is assumed that the semiconductor device 100 is used which has a structure similar to that described with reference to the first embodiment and when the device isolation insulating film 134 is formed by LOCOS.

Figure 11:
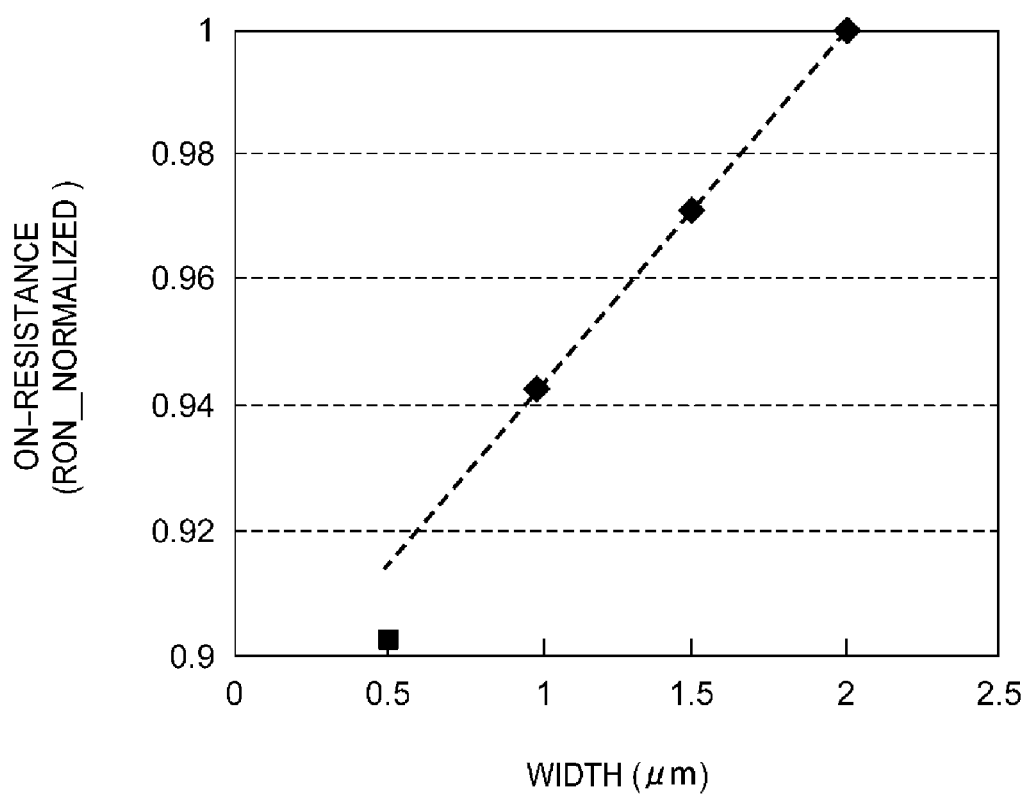
FIG. 11 is a view illustrating a simulation result when it is assumed that a semiconductor device is used which has a structure similar to that described with reference to the embodiment of the present invention.

FIG. 11 is a view illustrating a result of simulating the relationship between the width of the device isolation insulating film 134 and the On-resistance of a high voltage transistor 142 when it is assumed that the semiconductor device 100 is used which has a structure similar to that described with reference to the first embodiment and when the device isolation insulating film 134 is formed by LOCOS. Here, the drain-source voltage (Vds) is set to 0.1 V and the gate-source voltage (Vgs), to 12 V.

When the device isolation insulating film 134 is formed by LOCOS, as the width is narrowed as illustrated in FIG. 9, the film thickness becomes smaller. Further, when the device isolation insulating film 134 is formed by LOCOS, as the width is narrowed as illustrated in FIG. 10, the depth of a peak concentration section in the n-doped source region 114 formed under the device isolation insulating film 134 becomes greater. This is because, as the width of the device isolation insulating film 134 is narrowed, the film thickness of the device isolation insulating film 134 becomes also smaller and thus the dopant ion is implanted deeper through the device isolation insulating film 134.

Further, when the device isolation insulating film 134 is formed by LOCOS, as the width is narrowed as illustrated in FIG. 11, the On-resistance of the high voltage transistor 142 becomes lower. This is because of an effect such that the depth of a peak concentration section in the n-doped source region 114 becomes greater and also because of an effect such that the width of the device isolation insulating film 134 becomes narrower and the distance between the channel region 110a and the source electrode 120 becomes smaller.

The relationship between the width and film thickness of the device isolation insulating film 134 is, as illustrated in FIG. 9, linear in a range of width from 1 μm to 2 μm; but when the width becomes narrower than 1 μm and approaches 0.5 μm, the degree of decrease of film thickness is greater than that of width. As the width of the device isolation insulating film 134 decreases and the film thickness decreases, the depth of a peak concentration section in the n-doped source region 114 formed under the device isolation insulating film 134 becomes greater. Further, when the width of the device isolation insulating film 134 approaches 0.5 μm, the degree of decrease of film thickness is greater than that of width, so the On-resistance lowers to a greater extent than estimated from a linear relationship.

The embodiments of the present invention have been described above with reference to the drawings. However, these embodiments are merely exemplary of the present invention, and various other constitutions can also be used.

The high voltage transistor 142 according to the present embodiment may be formed so as to be mounted in a manner mixed with, for example, an ordinary LDMOS with a high breakdown voltage drain and low breakdown voltage gate or a MOS with a high breakdown voltage gate and drain. In this case, for example, each of the process of forming the lowly p-doped region 110 and the process of forming the n-doped drain region 112 and n-doped source region 114 can be carried out in parallel with the process of forming the lowly p-doped region of another device and the process of forming the source-drain region, so the semiconductor device 100 can be formed without increasing the number of processes.

Figure 12:
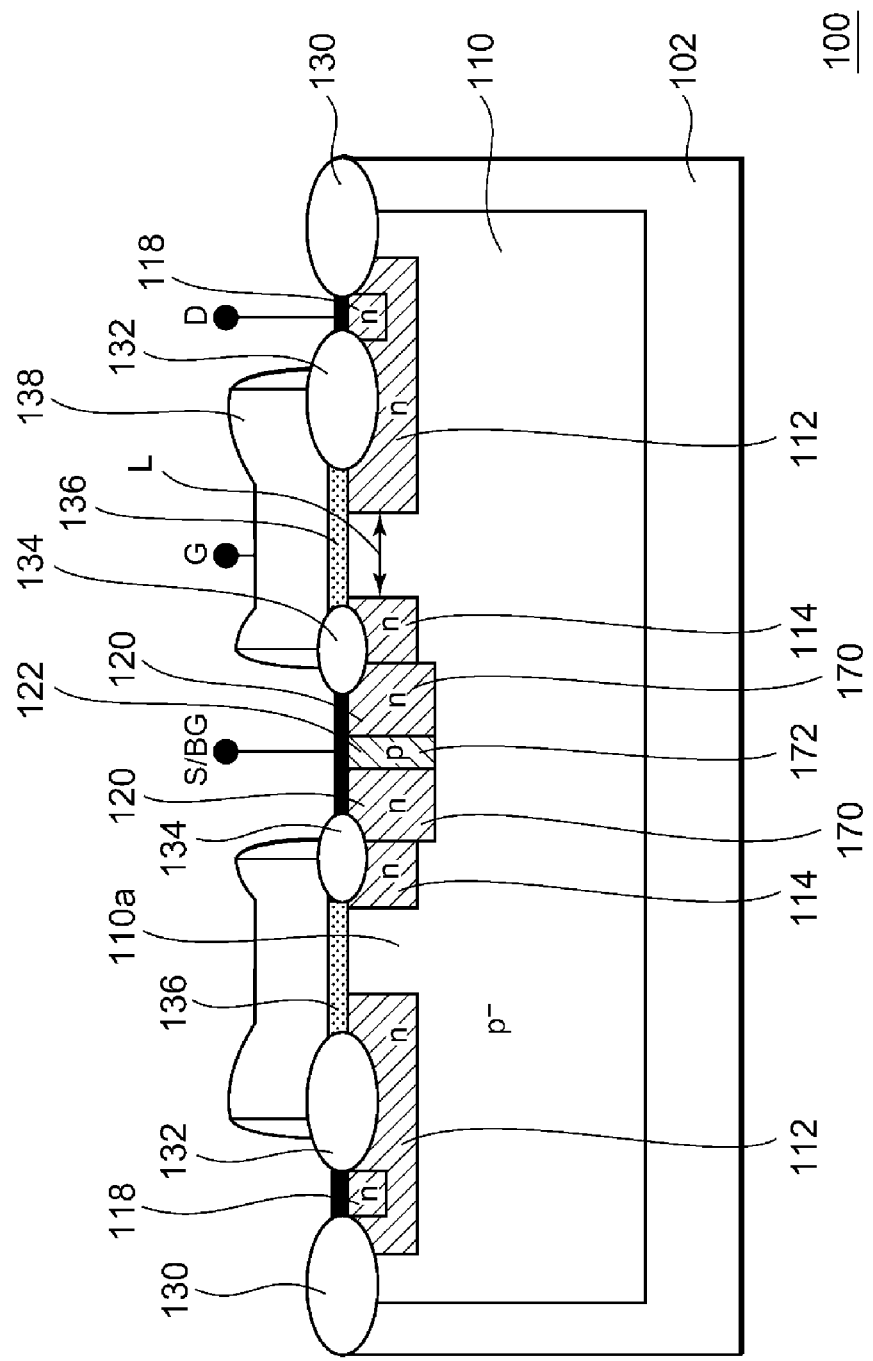
FIG. 12 is a sectional view illustrating another exemplary structure of the semiconductor device according to an embodiment of the present invention.

The semiconductor device 100 may also have a structure illustrated in FIG. 12.

Referring to FIG. 12, the semiconductor device 100 includes an n-well 170 formed under a source electrode 120 of an n-doped drain region 112 and a p-well 172 formed under a back gate electrode 122. The n-well 170 and the p-well 172 may be formed before the process of forming the n-doped drain region 112 and n-doped source region 114 is carried out.

In the above described embodiments, the first conduction type is p-type and the second conduction type is n-type; but the first conduction type may be n-type and the second conduction type, p-type.

It is apparent that the present invention is not limited to the above embodiments and descriptions, but may be modified and changed without departing from the scopes and sprits of the methods claims that are indicated in the subsequent pages as well as method claims that are indicated below:

AA. A semiconductor device fabricating method comprising:
forming a lowly doped region of a first conduction type in a substrate;
forming over the substrate, a first device isolation film and a second device isolation film smaller in film thickness than the first device isolation film;
forming on a surface of the lowly doped region of the first conduction type, a drain region of a second conduction type isolated by the first device isolation film and a source region of the second conduction type isolated by the second device isolation film and arranged so that a channel region lies between the drain region and the source region;
forming a gate electrode over the channel region;
forming the drain electrode on a side of a surface of the drain region which is isolated from the channel region by the first device isolation film; and
forming the source electrode on a side of a surface of the source region which is isolated from the channel region by the second device isolation film.

BB. The semiconductor device fabricating method according to claim AA,
wherein the first device isolation film is formed greater in width than the second device isolation film.

CC. The semiconductor device fabricating method according to claim AA,
wherein, in forming the drain region and the source region, the drain region and the source region are formed by the same ion implantation process.

What is claimed is:

1. A semiconductor device comprising:
a substrate having a first semiconductor region of a first conduction type in a surface portion of the substrate;
a second semiconductor region of a second conduction type formed in a part of the surface of the first semiconductor region;
a first electrode formed over the second semiconductor region;
a third semiconductor region of the second conduction type formed in a part of the surface of the first semiconductor region;
a second electrode formed over the third semiconductor region and electrically connected to the third semiconductor region;
a fourth semiconductor region of the first conduction type formed in a part of the surface of the first semiconductor region;
a third electrode electrically connected to the fourth semiconductor region and electrically connected to the fourth semiconductor region and the second electrode;
a gate insulating film formed so as to cover the surface of the first semiconductor region between the second semiconductor region and the third semiconductor region;
a gate electrode formed over gate insulating film;
a buried semiconductor region of the second conduction type formed under the first semiconductor region; and
a sinker layer of the second conduction type formed over the buried semiconductor region and extending from the buried semiconductor region to the surface of the substrate such that the first semiconductor region is surrounded by the sinker layer and the buried semiconductor region,
the sinker layer electrically connected to the first electrode.

2. The semiconductor device according to claim 1,
wherein the second electrode and the third electrode comprise silicide layers formed over the third semiconductor region and the fourth semiconductor region, respectively.

3. The semiconductor device according to claim 1, further comprising:
a first isolating insulating film lying between the gate insulating film and the first electrode and having a thickness greater than a thickness of the gate insulating film.

4. The semiconductor device according to claim 3, further comprising:
a second isolating insulating film lying between the gate insulating film and the second electrode and having a thickness greater than a thickness of the gate insulating film.

5. The semiconductor device according to claim 4,
wherein the thickness of the first isolating insulating film is greater than the thickness of the second isolating insulating film.

6. The semiconductor device according to claim 1, further comprising:
a second isolating insulating film lying between the gate insulating film and the second electrode and having a thickness greater than a thickness of the gate insulating film.

7. The semiconductor device according to claim 1,
wherein the first electrode comprises a silicide layer formed over the second semiconductor region.

8. The semiconductor device according to claim 1,
wherein the first electrode is electrically connected to the second semiconductor region.

* * * * *